United States Patent
Vandenbulcke et al.

Patent Number: 5,925,422
Date of Patent: *Jul. 20, 1999

[54] METHOD OF DEPOSITING A DIAMOND LAYER ON A TITANIUM SUBSTRATE

[75] Inventors: Lionel Vandenbulcke, Saint-Jean-le-Blanc; David Rats, Andel; Guy Farges, La Ville du Bois, all of France

[73] Assignee: Delegation Generale pour l'Armement, Paris, France

[*] Notice: This patent issued on a continued prosecution application filed under 37 CFR 1.53(d), and is subject to the twenty year patent term provisions of 35 U.S.C. 154(a)(2).

[21] Appl. No.: 08/635,758

[22] Filed: Apr. 22, 1996

[30] Foreign Application Priority Data

Apr. 21, 1995 [FR] France ................................ 95 04788

[51] Int. Cl.$^6$ .............................. B05D 3/06; C23C 16/26
[52] U.S. Cl. .................... 427/577; 427/533; 427/249; 427/255.7; 427/573
[58] Field of Search ................... 427/577, 249, 427/255.7, 573, 575, 533; 428/408; 423/446

[56] References Cited

U.S. PATENT DOCUMENTS

| Re. 34,173 | 2/1993 | Kerber | 428/610 |
|---|---|---|---|
| 4,734,339 | 3/1988 | Schachner et al. | 428/701 |
| 4,935,303 | 6/1990 | Ikoma et al. | 428/408 |
| 5,075,094 | 12/1991 | Morrish et al. | 423/446 |
| 5,308,661 | 5/1994 | Feng et al. | |
| 5,362,523 | 11/1994 | Gorynin et al. | 427/446 |

FOREIGN PATENT DOCUMENTS

| A-0 514 032 | 11/1992 | European Pat. Off. |
|---|---|---|
| A-35 22 583 | 2/1986 | Germany. |
| A-61-104078 | 5/1986 | Japan. |
| A-62-034704 | 2/1987 | Japan. |
| A-62-236630 | 10/1987 | Japan. |
| A-1-201480 | 8/1989 | Japan. |
| A-2-217472 | 8/1990 | Japan. |
| A-4-254584 | 9/1992 | Japan. |

OTHER PUBLICATIONS

Rats et al, Thin Solid Films 270 (1995) pp. 177–183, no month data.

Deuerler et al, Diamond Relat. Mater., 5(12) 1996 pp. 1478–1489 (Abstract), no month data.

Sood et al, Surf. Coat. Technol., 51(1–3), 1992 pp. 307–312 (Abstract), no month data.

Barnes et al, Appl. Phys. Lett. 62(1) pp. 37–39, Jan. 1993.

Singh et al, Appl. Phys. Lett. 61(24) pp. 2863–2865, Dec. 1992.

Journal of Applied Physics, Aug. 15, 1994, USA, Weiser P S et al. "Chemically Vapor Deposited Diamond Films Grown on Titanium Nitride Coated and Uncoated Iron Substrates", vol. 76, No. 4, pp. 2164–2168.

Journal of Materials Science, Dec. 15, 1992, UK, Pivin J C "Tribology of Amorphous Diamond Films Grown or Modified by Ion Implantation", pp. 6735–6742.

*Primary Examiner*—Roy V. King
*Attorney, Agent, or Firm*—Oliff & Berridge, PLC

[57] ABSTRACT

A method of manufacturing a metal part coated with a layer of polycrystalline diamond includes fabricating a metal substrate having a surface to be coated, the metal substrate containing titanium, vanadium or alloys thereof; depositing a layer of at least 10% graphitic plus amorphous carbon and designed to diffuse fully through the titanium; and depositing a diamond coating on the carbon layer.

12 Claims, 3 Drawing Sheets

5,925,422

METHOD OF DEPOSITING A DIAMOND LAYER ON A TITANIUM SUBSTRATE

BACKGROUND OF THE INVENTION

The present invention relates to a method of manufacturing a metal part coated with a layer of polycrystalline diamond as well as a metal part obtained by such a manufacturing process.

The invention relates in particular to a method for manufacturing a part made of titanium or titanium alloy covered with a polycrystalline diamond layer as well as a titanium part obtained by this manufacturing process.

Titanium and titanium alloy parts designate metal parts whose principal component is titanium, which may or may not be alloyed with other elements in a lower concentration.

An alloy very commonly used for manufacturing such parts is the alloy known as "TA6V" alloy.

It is known that titanium alloys, particularly the TA6V alloy, have good mechanical characteristics, particularly good tensile strength, good resistance to fatigue, corrosion, and creep, and a relatively low density. These alloys are hence widely used in the aeronautical and space industries.

It is also known that titanium has very good biological immunity and is hence widely used in the biomedical field.

However, titanium alloys have poor wear resistance, particularly when they are in contact with a metal or a metal alloy and a high friction coefficient with a large number of materials.

In addition, titanium alloys can have a certain toxicity due to the presence of other alloy elements.

To remedy these drawbacks, a carbon layer for example is deposited on the titanium alloys, for example in the form of a polycrystalline diamond layer, which, depending on the utilization of the alloy, allows wear resistance to be increased and biological immunity to be improved.

At the present time, the polycrystalline diamond layer is deposited on the metal part at a high temperature, in the range from 800 to 850° C. which, upon return to room temperature, triggers the appearance of very substantial residual stresses, on the order of 7 GPa, in the diamond layer. Present-day techniques of coating a part with a diamond layer hence do not allow diamond layers of greater thickness than 1 micron to be deposited without their flaking off upon cooling.

Moreover, diamond deposition at high temperatures brings about relatively high diffusion of carbon into the underlying metal, which causes deep changes in the intrinsic mechanical properties of the underlying metal.

The attempt has been made to remedy these drawbacks by depositing a polycrystalline diamond layer on a metal substrate at a lower temperature, for example less than approximately 700° C. Deposition at such a temperature allows a thicker layer to be obtained, but adhesion of the diamond to the metal is relatively poor.

SUMMARY OF THE INVENTION

A goal of the present invention is to remedy the stated drawbacks by proposing a method for manufacturing a metal part coated with a polycrystalline diamond layer of relatively substantial thickness wherein the residual stresses at room temperature are less than approximately 6 GPa and bring about no significant changes in the mechanical properties of the metal part.

The method of manufacturing a metal part coated with a polycrystalline diamond layer comprising the steps of:

making a metal substrate having a surface to be coated that contains titanium or vanadium;

in a first step, depositing a layer of carbon that clings to the diamond, having at least 10% graphitic or amorphous carbon and designed to diffuse fully through the titanium during a second step; and in the second step, depositing the diamond coating over the cling layer.

The method according to the invention can in addition comprise one or more of the following characteristics:

During the metal substrate manufacturing step, a coating layer including titanium is deposited on a metal mass;

Prior to deposition of the coating layer, a refractory layer designed to form a barrier to diffusion of carbon through the metal substrate is deposited on the metal mass;

The metal mass is comprised of titanium or titanium alloy;

The metal mass is comprised of steel or cemented carbide;

The metal mass is comprised of cemented carbide and coated with a layer of titanium carbide prior to deposition of the refractory layer to improve its adhesion to the metal mass;

The refractory layer is comprised of a material chosen from the group comprised of titanium nitride, vanadium nitride, niobium, tantalum, tungsten, and molybdenum, or an alloy including an element chosen from this group;

The refractory layer is comprised of titanium nitride, coated with a second cling layer including nitrogen and titanium with a decreasing nitrogen concentration in the direction of the coating layer to improve adhesion of the latter on the refractory layer;

The stages of depositing the cling layer and the diamond coating are carried out at a temperature between 400° C. and 700°C.;

The metal mass being comprised of cemented carbide, the stages of depositing the cling layer and the diamond coating are carried out at temperatures between 400° C. and 700° C. and between 700° C. and 850° C., respectively.

The invention also relates to a metal part made of steel or including titanium and comprising a metal substrate having a surface to be coated including titanium, covered with polycrystalline diamond, characterized by including a carbide layer interposed between the diamond coating and the surface to be coated with titanium, coming from diffusion of carbon in the surface to be coated, the diamond coating having a suitable thickness, for example, between about 1 and 10 microns.

The metal part according to the invention can in addition have one or more of the following characteristics:

The metal substrate also has a refractory layer disposed under the surface to be coated and designed to form a barrier to diffusion of carbon in the metal substrate;

The metal substrate is comprised of titanium or titanium alloy;

The metal substrate is comprised of a steel metal mass covered with a layer including titanium or vanadium;

The refractory layer is composed of a material chosen from the group constituted by titanium nitride, vanadium nitride, niobium, tantalum, tungsten, and molybdenum, or an alloy including a material chosen from this group;

When the refractory layer is composed of titanium nitride, the metal substrate also has a second cling layer including nitrogen and titanium interposed between the surface to be coated and the refractory layer and having a decreasing nitrogen concentration in the direction of the surface to be coated with a view to improving adhesion thereof to the refractory layer.

Other characteristics and advantages will emerge from the description hereinbelow provided as an example having regard to the attached drawings.

DETAILED DESCRIPTION OF PREFERRED EMBODIMENTS

Figure 1:
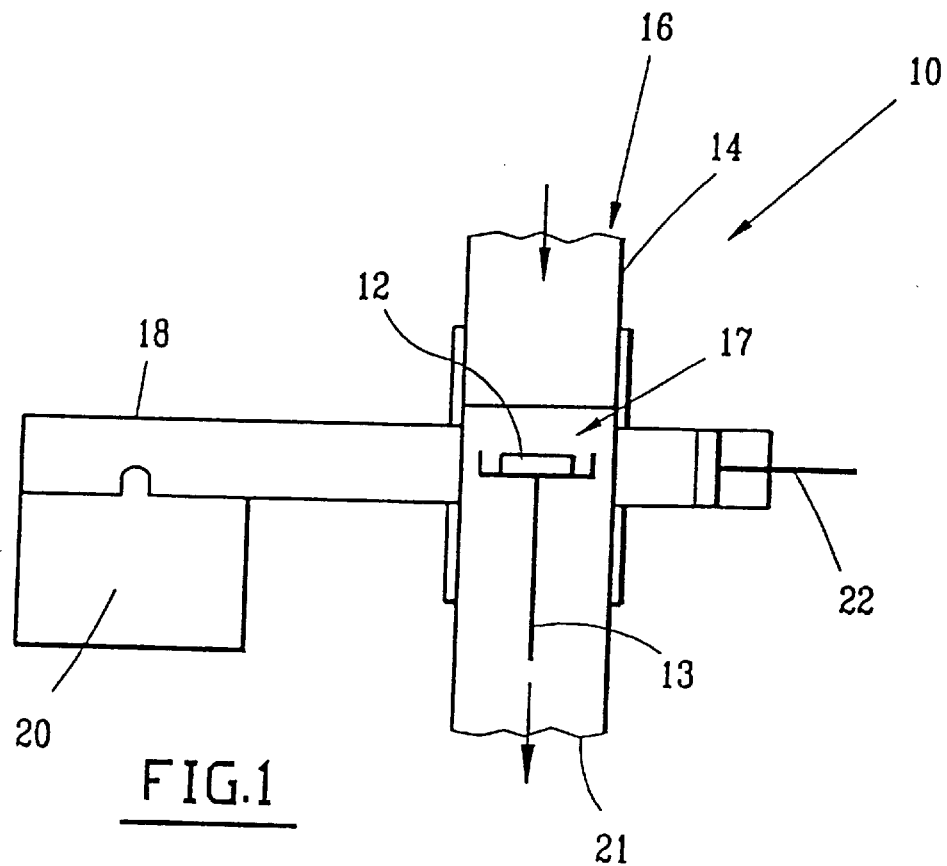
FIG. 1 represents a cross section through a device for depositing a layer of polycrystalline diamond on a metal substrate for implementing the method according to the invention.

FIG. 1 shows a plasma-assisted chemical deposition device known as a PAVD device and designated by reference numeral 10.

PAVD device 10 is designed to deposit a diamond layer on a metal part designated by reference numeral 12, disposed on a support 13.

"Metal part" is understood to be a part made of metal, a metal alloy, or a compound.

PAVD device 10 has a silica enclosure 14 provided with an opening 16 for supplying gas to a deposition area 17 in which a plasma in produced by means of a waveguide 18 connected with a microwave wave generator 20.

The gases whose path is illustrated by arrows emerge through an opening 21.

In addition, silica enclosure 14 is connected in known fashion to a vacuum pump not shown.

In addition, PAVD device 10 has adaptation means allowing the power of the microwave waves reflected on part 12 to be limited and the position of the plasma to be adjusted in front of the part to be coated, consisting of a piston 22.

PAVD device 10 is supplemented by adaptation means, a system for adjusting the gas flowrate and controlling and regulating pressure, of a known type, which means and system are not shown.

Metal part 12 is composed of a titanium alloy of the TA6V type.

PAVD device 10 allows deposition on metal part 12, possibly prepared by ion treatment, of a layer of polycrystalline diamond at temperatures between 400° C. and 700° C. To accomplish this, a cling carbon layer for the diamond having at least 10% graphitic or amorphous carbon and designed to diffuse fully through the titanium is deposited on the surface to be coated of the titanium alloy part, and the cling layer is coated with diamond in the course of total diffusion of the cling carbon through the titanium.

Once the diamond has been deposited on the metal part, a fine layer of titanium carbide is formed under the diamond layer, whose thickness depends on the deposition, duration, and temperature conditions.

Figure 2:
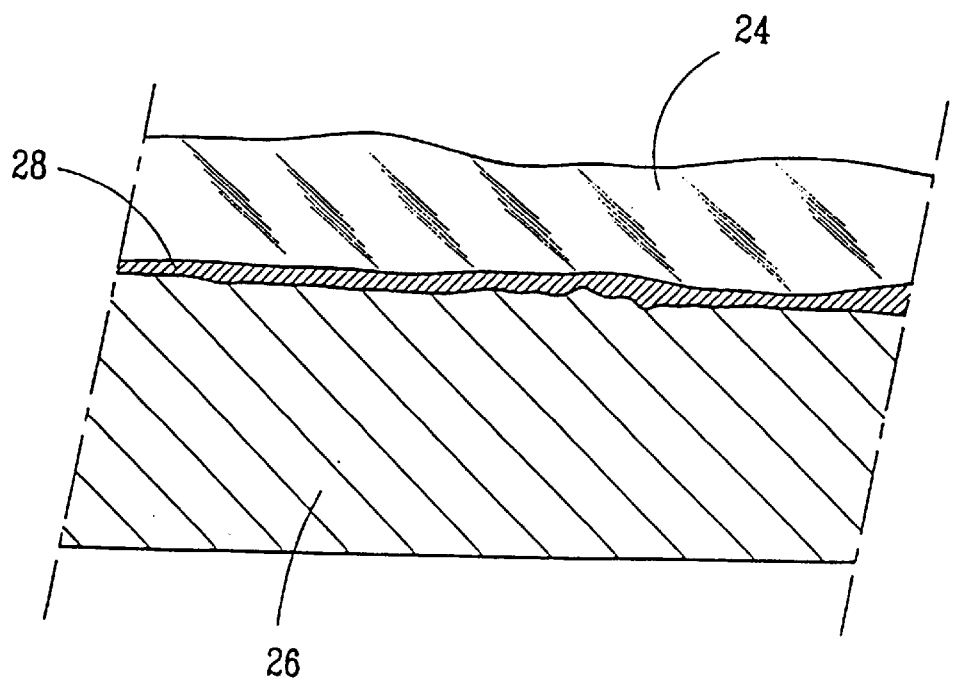
FIG. 2 is a schematic cross section of a metal part obtained by a first method according to the invention.

FIG. 2 shows that the metal part thus obtained has a layer of polycrystalline diamond 24 adhering to the TA6V alloy 26 by means of a titanium carbide layer 28.

Figure 3:
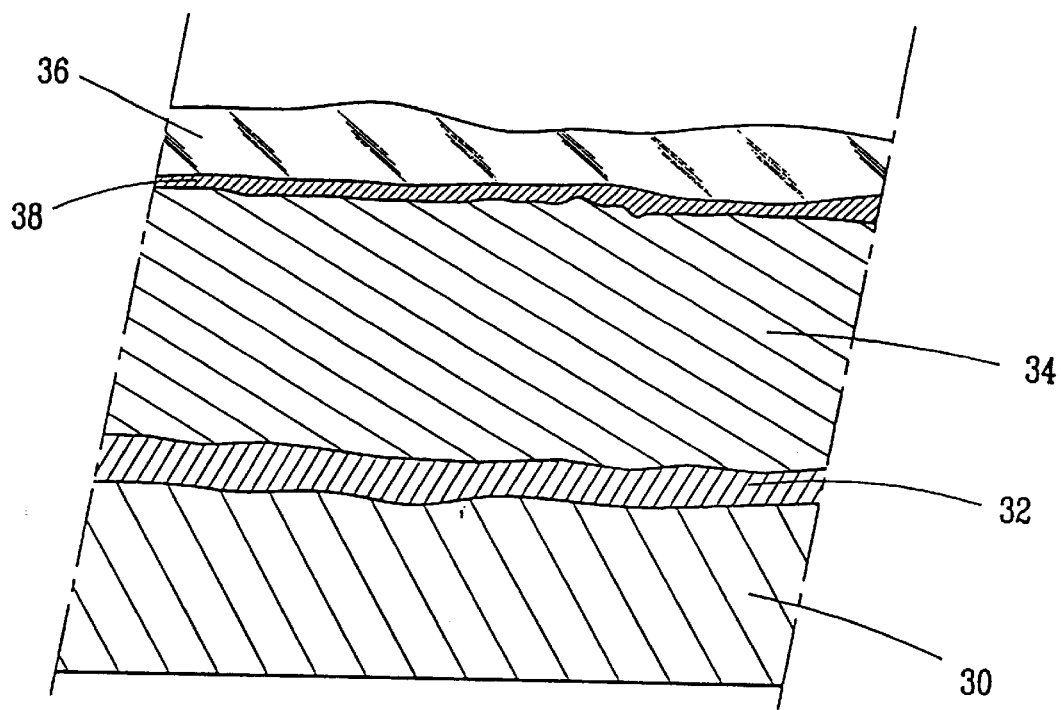
FIG. 3 is a schematic cross section of a metal part obtained by a second method according to the invention.

As an alternative, as shown in FIG. 3, a metal substrate composed of a mass of TA6V alloy 30 coated with a layer of refractory material 32 on which a titanium coating 34 is deposited, is used.

As before, a polycrystalline diamond layer 36 is then deposited on titanium coating layer 34, previously coated with a cling carbon layer intended to form a titanium carbide layer 38.

The refractory layer is preferably composed of a material chosen from the group comprised of titanium nitride, vanadium nitride, niobium, tantalum, tungsten, and molybdenum, or an alloy having an element chosen from this group.

It is designed to form a barrier to diffusion of carbon to prevent the latter penetrating the TA6V alloy 30 so that the mechanical characteristics within the alloy become modified while the diamond is being deposited.

Figure 4:
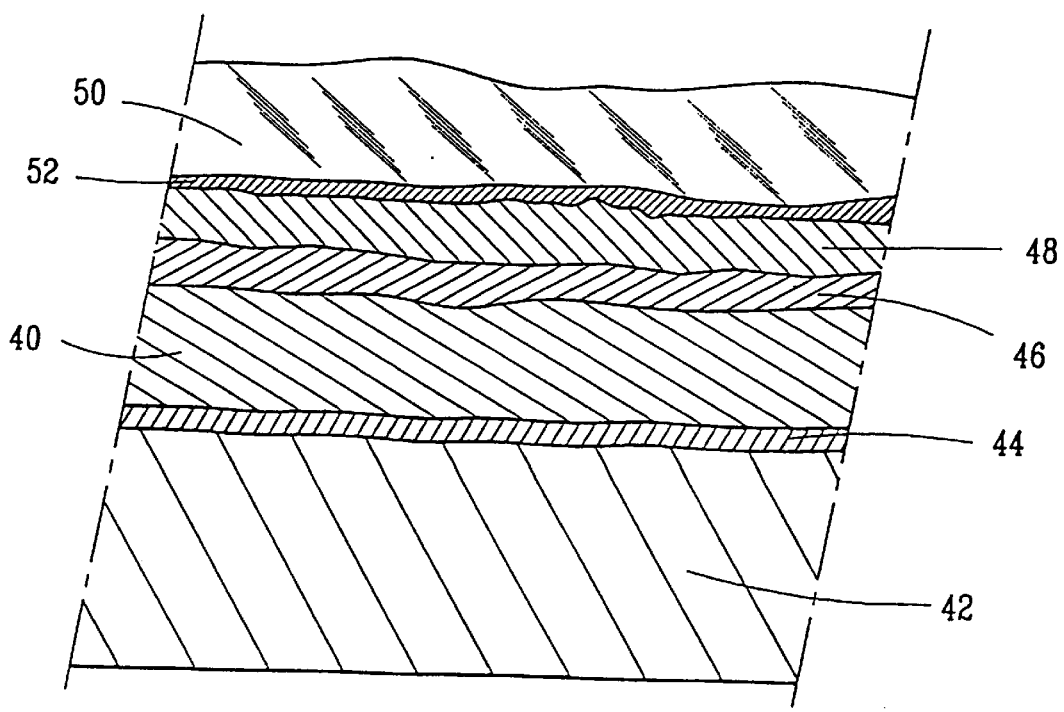
FIG. 4 is a schematic cross section of a metal part obtained by a third method according to the invention.

According to another alternative shown in FIG. 4, in the case where refractory layer 40 is composed of titanium nitride, this layer can be deposited on TA6V alloy 42 with interposition of a titanium layer 44 designed to improve adherence of refractory layer 40 to alloy 42.

A second cling layer containing nitrogen and titanium, 46, designed to cling to titanium layer 48 on refractory layer 40 made of titanium nitride, can also be interposed between this refractory layer 40 and titanium layer 48. The second cling layer 46 has a decreasing nitrogen concentration in refractory layer 40 in the direction of layer 48 to be coated to improve adhesion of the latter layer to refractory layer 40.

As in the previous example, titanium layer 48 is then coated with a diamond layer 50 with prior interposition of cling carbon to form a titanium carbide layer 52.

In the various alternatives of the polycrystalline diamond layer deposition method described, the metal part is comprised of titanium alloy of the TA6V type.

However, it is possible by means of this method to deposit a polycrystalline diamond layer on a metal part comprised of a titanium-free metal mass covered with a coating layer including titanium or a titanium alloy, vanadium, or a vanadium alloy.

Thus, the metal mass can be comprised of steel or cemented carbide.

In the latter case, where the metal mass is composed of cemented carbide, it is coated with a titanium carbide layer with a temperature of between 400° C. and 700° C. prior to deposition of the refractory layer in order to improve adhesion of this refractory layer to the metal mass. The diamond layer can then be deposited at a temperature of between 700° C. and 850° C.

Examples of implementation of the method according to the invention will now be described.

In all these examples, the surface on which the diamond is deposited is prepared by classical polishing followed by diamond polishing so that the surface of the metal part to be coated can be seeded.

EXAMPLE 1

Diamond is deposited directly on a TA6V type alloy by means of the device shown in FIG. 1 in two successive stages, which may be separated by a return to room temperature.

In the first stage, a carbon cling layer with a graphitic or amorphous phase proportion of over approximately 30% is deposited on a TA6V alloy part under the following conditions:

hydrogen flowrate equal to 200 cm$^3$/min;
methane flowrate equal to 12 cm$^3$/min;
microwave power equal to 400 W;
pressure equal to 2.5 Torr;
temperature equal to 600° C.;
deposition duration equal to 3 hours.

In a second stage, a polycrystalline diamond coating is deposited on the metal part coated with the cling layer under the following conditions:

hydrogen flowrate equal to 400 cm$^3$/min;
methane flowrate equal to 4 cm$^3$/min;
microwave power equal to 400 W;
pressure equal to 10 Torr;
temperature equal to 600° C.;
deposition duration equal to 30 hours.

Thus, a part made of TA6V alloy shown in FIG. 2 is obtained, the alloy structure of which has not been modified, and which is coated with a 5-micron thick diamond layer.

The stresses measured in the diamond layer are essentially 5 GPa. These lower stresses hence allow a layer greater than 1 micron thick to be deposited without the layer peeling on return to room temperature.

In addition, the friction coefficient of this diamond-coated alloy measured under classical conditions after cooling is substantially less than 0.1.

EXAMPLE 2

A metal part made of TA6V alloy is coated with a polycrystalline diamond layer by means of the device in FIG. 1 in two successive stages which may be separated by a return to room temperature.

In the first stage, a carbon cling layer is deposited on the alloy part under the following conditions:

hydrogen flowrate equal to 200 cm$^3$/min;
methane flowrate equal to 12 cm$^3$/min;
microwave power equal to 400 W;
pressure equal to 2.5 Torr;
temperature equal to 600° C.;
deposition duration equal to 3 hours.

In the second stage, the part is coated with polycrystalline diamond under the following conditions:

hydrogen flowrate equal to 180 cm$^3$/min;
carbon monoxide flowrate equal to 15 cm$^3$/min;
microwave power equal to 400 W;
pressure equal to 10 Torr;
temperature equal to 600° C.;
deposition duration equal to 25 hours.

The TA6V alloy part thus obtained is coated with a diamond layer 8 microns thick and its characteristics remain substantially unchanged. In addition, the stresses measured in the diamond layer after cooling are approximately 5 GPa. These lower stresses allow a layer greater than approximately 1 micron in thickness to be deposited without the layer peeling upon return to room temperature. The friction coefficient measured in classical fashion is less than approximately 0.1.

EXAMPLE 3

Diamond deposition is accomplished on a TA6V alloy previously coated by a physical vapor deposition (PVD) technique with a titanium nitride refractory layer 3 microns thick, with a second titanium nitride layer having a nitrogen concentration that decreases in the outward direction and is 1 micron thick to increase adhesion of the refractory layer, and a titanium layer 3 microns thick.

The diamond is deposited by means of the device of FIG. 1 in two successive stages which may be separated by a return to room temperature.

In a first stage, the cling carbon for the diamond is deposited under the following conditions:

hydrogen flowrate equal to 200 cm$^3$/min;
methane flowrate equal to 12 cm$^3$/min;
microwave power equal to 400 W;
pressure equal to 2.5 Torr;
temperature equal to 600° C.;
deposition duration equal to 3 hours.

In the second stage, the diamond is deposited under the following conditions:

hydrogen flowrate equal to 180 cm$^3$/min;
carbon monoxide flowrate equal to 15 cm$^3$/min;
microwave power equal to 400 W;
pressure equal to 10 Torr;
temperature equal to 600° C.;
deposition duration equal to 7 hours.

This produces a TA6V alloy part whose structure has remained unchanged, coated first with a titanium nitride refractory layer comprising a diffusion barrier for the carbon and with intermediate sublayers including an outer diamond layer 1.5 microns thick adhering to the titanium by means of a titanium carbide layer.

Such a metal part is shown schematically in FIG. 4 described above.

The stresses measured in the diamond layer after cooling are substantially 5 GPa and the friction coefficient is substantially less than 0.1.

EXAMPLE 4

Diamond deposition is accomplished on a TA6V alloy previously coated by PVD with a titanium nitride refractory layer 3 microns thick, a second titanium nitride layer intended to improve adhesion of the refractory layer, having a decreasing nitrogen concentration gradient in the outward direction and a thickness of 1 micron, plus a titanium layer 0.5 micron thick.

The diamond is deposited by means of the device according to FIG. 1 in two successive stages which may be separated by a return to room temperature.

In the first stage, a cling carbon layer for the diamond is deposited on the metal part under the following conditions:

hydrogen flowrate equal to 200 cm$^3$/min;
methane flowrate equal to 12 cm$^3$/min;
microwave power equal to 400 W;
pressure equal to 2.5 Torr;
temperature equal to 600° C.;
deposition duration equal to 3 hours.

In the second stage, the alloy is coated with a polycrystalline diamond layer under the following conditions:

hydrogen flowrate equal to 180 cm$^3$/min;
carbon monoxide flowrate equal to 15 cm$^3$/min;
microwave power equal to 400 W;
pressure equal to 10 Torr;
temperature equal to 600° C.;

deposition duration equal to 7 hours.

Thus, one obtains a TA6V alloy part whose characteristics have not been changed, coated with intermediate sublayers including a titanium nitride refractory layer forming a carbon diffusion barrier and an outer diamond layer 1.5 microns thick adhering to the titanium nitride through a titanium carbide layer and an underlying titanium carbonitride layer.

Moreover, the stresses measured in the diamond layer after cooling are substantially 5 GPa and the friction coefficient is substantially less than 0.1.

EXAMPLE 5

Diamond is deposited on a TA6V alloy previously coated by PVD with a niobium refractory layer 0.5 micron thick then a titanium layer 3 microns thick.

The diamond is deposited by means of the device according to FIG. 1 in two successive stages which may be separated by a return to room temperature.

In the first stage, a cling carbon layer for the diamond is deposited on the metal part under the following conditions:

hydrogen flowrate equal to 200 cm$^3$/min;

methane flowrate equal to 12 cm$^3$/min;

microwave power equal to 400 W;

pressure equal to 2.5 Torr;

temperature equal to 600° C.;

deposition duration equal to 3 hours.

In the second stage, the alloy is coated with a polycrystalline diamond layer under the following conditions:

hydrogen flowrate equal to 180 cm$^3$/min;

carbon monoxide flowrate equal to 15 cm$^3$/min;

microwave power equal to 400 W;

pressure equal to 10 Torr;

temperature equal to 600° C.;

deposition duration equal to 7 hours.

Thus, one obtains a TA6V alloy part whose structure has not been changed, coated with intermediate sublayers being a niobium layer forming a carbon diffusion barrier and an outer diamond layer 1.5 microns thick adhering to the titanium nitride through a titanium carbide layer.

Moreover, the stresses measured in the diamond layer after cooling are substantially 5 GPa and the friction coefficient is substantially less than 0.1.

EXAMPLE 6

Diamond is deposited on a 30CD12 type steel (composition approximately 0.30% C, 0.55% Mn, 0.25% Si, 3% Cr, 0.40% Mo) which has previously been coated by PVD with a refractory layer forming a titanium nitride diffusion barrier 3 microns thick, a titanium layer with a nitrogen gradient directed to the outside of the part and 1 micron thick, and a titanium layer 3 microns thick.

The diamond is deposited in the device of FIG. 1 in two successive stages which may be separated by a return to room temperature.

In the first stage, a cling carbon layer for the diamond is deposited on the alloy part under the following conditions:

hydrogen flowrate equal to 200 cm$^3$/min;

methane flowrate equal to 12 cm$^3$/min;

microwave power equal to 400 W;

pressure equal to 2.5 Torr;

temperature equal to 580° C.;

deposition duration equal to 3 hours.

In the second stage, the alloy part is coated with a polycrystalline diamond layer under the following conditions:

hydrogen flowrate equal to 400 cm$^3$/min;

methane flowrate equal to 4 cm$^3$/min;

microwave power equal to 400 W;

pressure equal to 10 Torr;

temperature equal to 580° C.;

deposition duration equal to 9 hours.

Thus, a steel part of the 30CD12 type is obtained, whose structure in unmodified, coated with intermediate sublayers one of which is a titanium nitride layer constituting a carbon diffusion barrier, as well as an outer diamond layer 1.5 microns thick adhering to the titanium through a titanium carbide layer.

The stresses measured in the diamond layer after cooling are approximately 6 GPa and the friction coefficient is less than approximately 0.1.

The various embodiments described allow a metal part to be obtained having a surface containing titanium coated with a polycrystalline diamond layer adhering strongly to the surface of the part due to prior deposition of a cling carbon layer diffusing into the titanium and forming a titanium carbide layer.

Figure 5:
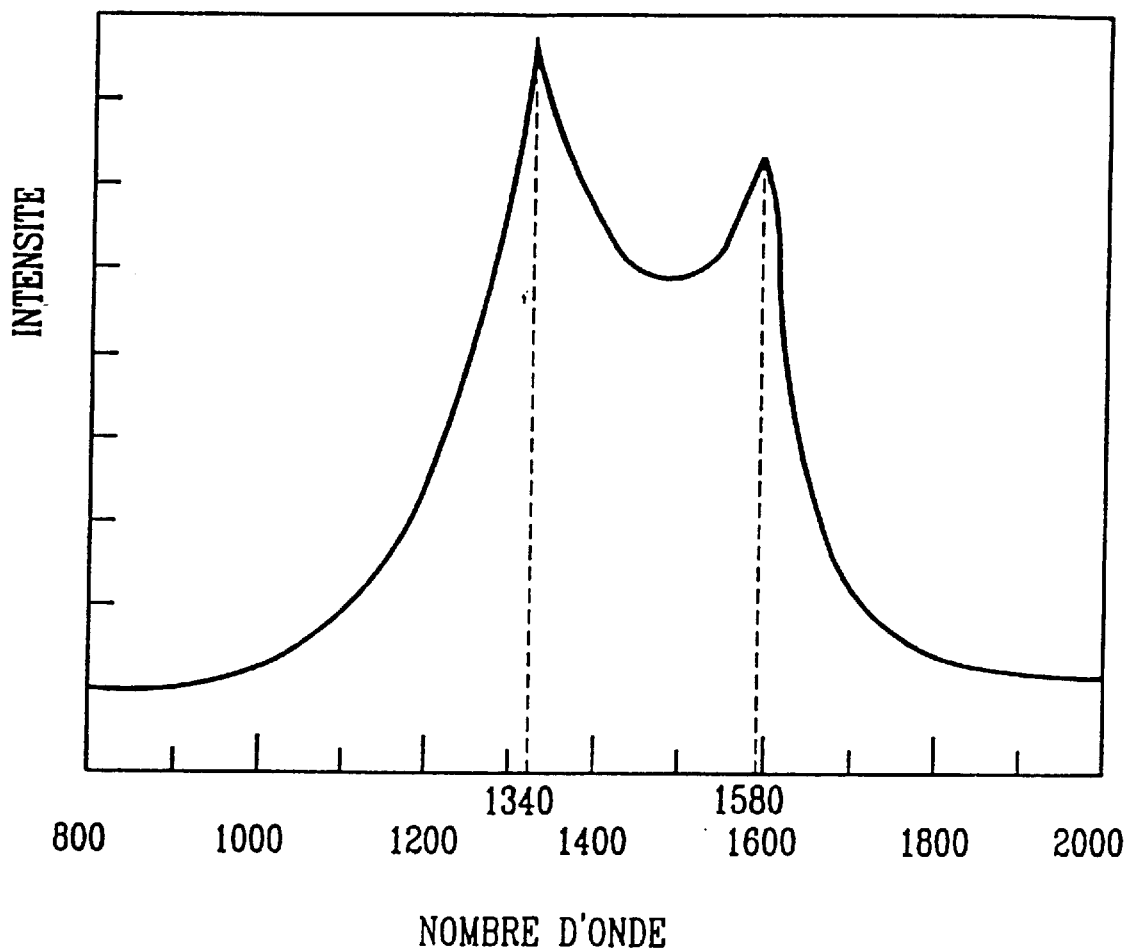
FIG. 5 is a Raman spectroscopy recording obtained on the cling carbon layer of the metal parts in FIGS. 2 to 4.

FIG. 5 is a Raman spectroscopy recording showing the intensity of a wave reflected by the metal part as a function of the wave number of the incident wave. This recording is obtained from the cling carbon layer for the diamond of the metal parts coated with diamond according to Examples 1 to 6.

The intensity peaks at 1340 and 1580 cm$^{-1}$ show the graphitic nature of the carbon deposited as the lowintensity carbon peak is buried in the 1340$^1$ band.

From this spectrum, and bearing in mind the Raman diffusion cross section ratio between the non-diamond carbon and the diamond, which is 50 to 75, the proportion of amorphous or graphitic carbon can be estimated to be over 30%.

This cling carbon layer totally diffuses into the underlying layer including titanium and thus no longer appears at the end of the diamond layer deposition operation. It allows the metal part to be coated with a polycrystalline diamond layer at a temperature lower than 700° C.

Alternatively, the cling layer allows the cemented carbide parts whose intrinsic properties remain unchanged up to 850° C. to be coated, achieving better cling of the diamond layer. It can thus be seen that this diamond layer can be deposited at temperatures of between 700° C. and 850° C.

As stated above, the cling layer allows a diamond layer thicker than 1 micron to be deposited while preventing it from peeling on return to ambient temperature and preventing a change in the alloy entering into the composition of the metal part to be coated with diamond.

What is claimed is:

1. A method of manufacturing a metal part coated with a layer of polycrystalline diamond, said method comprising:

depositing a layer of carbon having at least 10% graphitic plus amorphous carbon onto a surface of a metal substrate, said metal substrate surface comprising at least one of titanium and its alloys; and depositing a polycrystalline diamond coating on said carbon layer, said layer of carbon diffusing fully through the titanium during said depositing of said polycrystalline diamond, wherein said depositing the polycrystalline diamond coating is carried out at temperature in the range of 400–700° C. from an activated gaseous mixture at a pressure of approximately 10 Torr, said activated gaseous mixture including an oxygen containing compound.

2. The method of claim 1 wherein the metal substrate comprises titanium or titanium alloy.

3. The method of claim 1 further comprising fabricating said metal substrate by a process comprising depositing a coating layer containing titanium on a metal mass to manufacture the metal substrate.

4. The method of claim 3 wherein the metal mass is prepared by ion treatment in order to improve adhesion of the carbon layer to the metal mass.

5. The method of claim 3 wherein prior to deposition of the coating layer containing titanium, a refractory layer designed to form a barrier to carbon diffusion is deposited on the metal mass.

6. The method of claim 3 wherein the metal mass comprises titanium or titanium alloy.

7. The method of claim 5 wherein the metal mass comprises steel or cemented carbide.

8. The method of claim 7 wherein the metal mass comprises cemented carbide and is coated with a titanium carbide layer prior to deposition of the refractory layer.

9. The method of claim 5 wherein the refractory layer comprises at least one material selected from the group consisting of titanium nitride, vanadium nitride, niobium, tungsten, tantalum, molybdenum, and alloys thereof.

10. The method of claim 9 wherein the refractory layer comprises titanium nitride and is coated with a layer comprising nitrogen and titanium wherein the nitrogen concentration decreases in the direction of the titanium coating layer.

11. The method of claim 1 wherein the deposition of the carbon layer is carried out at a temperature of between 400° C. and 700° C.

12. The method of claim 1, wherein carbon monoxide is included in the activated gas mixture.

* * * * *